(12) United States Patent
Kuo et al.

(10) Patent No.: US 8,970,800 B2
(45) Date of Patent: Mar. 3, 2015

(54) BACKPLANE, BACKLIGHT MODULE AND LCD DEVICE

(75) Inventors: Yi-cheng Kuo, Shenzhen (CN); Gege Zhou, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 491 days.

(21) Appl. No.: 13/378,092

(22) PCT Filed: Dec. 2, 2011

(86) PCT No.: PCT/CN2011/083334
§ 371 (c)(1),
(2), (4) Date: Dec. 14, 2011

(87) PCT Pub. No.: WO2013/075351
PCT Pub. Date: May 30, 2013

(65) Prior Publication Data
US 2013/0128181 A1    May 23, 2013

(30) Foreign Application Priority Data
Nov. 21, 2011   (CN) .......................... 2011 1 0371617

(51) Int. Cl.
*G02F 1/1333*    (2006.01)
*H05K 7/20*      (2006.01)
*G02F 1/1335*    (2006.01)

(52) U.S. Cl.
CPC ...... *H05K 7/20963* (2013.01); *G02F 1/133608* (2013.01); *G02F 2001/133628* (2013.01)
USPC ........................................... 349/58; 349/161

(58) Field of Classification Search
CPC ..................... H05K 7/20963; G02F 1/133608; G02F 2001/133628; G02F 2001/133314
USPC .................. 349/58, 61, 65, 161; 361/679.54; 362/612, 633, 97.3, 294
See application file for complete search history.

(56) References Cited

U.S. PATENT DOCUMENTS 7,859,608 B2    12/2010  Fukuda
2008/0165307 A1*  7/2008  Adachi et al. ................... 349/62
(Continued)

FOREIGN PATENT DOCUMENTS

| CN | 101281319 A | 10/2008 |
| CN | 101761834 A | 6/2010 |

(Continued)

OTHER PUBLICATIONS

Computer-generated English translation of CN 102200259, Sep. 2011, pp. 1-4.*

(Continued)

*Primary Examiner* — Dung Nguyen
*Assistant Examiner* — Tai Duong
(74) *Attorney, Agent, or Firm* — IPro, Inc.; Na Xu

(57) ABSTRACT

The present invention discloses a backplane, a backlight module, and an LCD device. A backplane comprises a heatsink plate and a supporting plate connected with the heatsink plate; the heat conductivity of the heatsink plate is larger than that of the supporting plate; the heatsink plate or the supporting plate is provided with reinforcing ribs in the joint. In the present invention, metal with good heat dispersion and common material with low cost are respectively adopted and joined according to different radiating areas of the backlight module; then, the heat dispersion is ensured and meanwhile, the cost is reduced. The reinforcing ribs are added in the joint so that the strength of the joint is enhanced and the backplane is tightened and durable.

21 Claims, 4 Drawing Sheets

(56) References Cited

U.S. PATENT DOCUMENTS

| | | | |
|---|---|---|---|
| 2008/0170400 A1* | 7/2008 | Maruyama | 362/294 |
| 2010/0073904 A1 | 3/2010 | Tsai et al. | |
| 2011/0170034 A1* | 7/2011 | Jeong | 349/61 |

FOREIGN PATENT DOCUMENTS

| CN | 201672468 U | 12/2010 |
|---|---|---|
| CN | 201699722 U | 1/2011 |
| CN | 102200259 A | 9/2011 |
| CN | 102243390 A | 11/2011 |
| CN | 201110308489.5 | 6/2012 |

OTHER PUBLICATIONS

Computer-generated English translation of CN 101281319, Oct. 2008, pp. 1-6.*
Yao Wenjie, the first office action, Jul. 2012, CN.
Dai Yunli, the International Searching Authority written comments, Sep. 2012, CN.
Yao Wenjie, the second office action, Mar. 2013, CN.

* cited by examiner

BACKPLANE, BACKLIGHT MODULE AND LCD DEVICE

TECHNICAL FIELD

The present invention relates to the field of liquid crystal displays, and more particularly to a backplane, a backlight module and a liquid crystal display (LCD) device.

BACKGROUND

An LCD device includes a display panel and a backlight module for providing a light source to the display panel, wherein the bottom of the backlight module is provided with a backplane used for supporting internal devices and sealing the module and providing necessary protection. The existing backplane is generally made of the same material; the material used is an aluminum plate, an iron plate or plastics. If the whole backplane is made of the iron plate, a radiating element shall be added, causing increase of cost; if the whole backplane is made of the aluminum plate, the radiating element is not added and used; although the heat conduction effect of the aluminum plate is better than that of the iron plate, the aluminum plate has high cost and also increases the cost.

SUMMARY

The aim of the present invention is to provide a backplane with low cost, good heat dispersion, tightening property and durability, a backlight module and an LCD device.

The aim of the present invention is achieved by the following technical schemes.

A backplane, comprising a heatsink plate and a supporting plate connected with the heatsink plate; the heat conductivity of the heatsink plate is larger than that of the supporting plate; the heatsink plate or the supporting plate is provided with reinforcing ribs in the joint.

Preferably, the heatsink plate and the supporting plate are both provided with reinforcing ribs in the joint. Because the heatsink plate and the supporting plate are both provided with the reinforcing ribs, the strength of the backplane can be further enhanced.

Preferably, the backplane also comprises a reinforcing bracket; both ends of the reinforcing bracket are respectively fixed on the heatsink plate and the supporting plate; the reinforcing bracket is spanned between the heatsink plate and the supporting plate for enhancing the planeness of the backplane.

Preferably, the contact surfaces of the reinforcing bracket with the heatsink plate and the supporting plate are planes. Because the contact surfaces are the planes, the planeness of the heatsink plate and the supporting plate can be further enhanced.

Preferably, the reinforcing bracket is fixed on both ends of the joint of the heatsink plate and the supporting plate; in the utilization process, the middle position of the backplane corresponds to a device of the liquid crystal backlight module and the space is valuable; thus, both ends of the joint, i.e. the positions of both ends of the backplane, can be used for installing the reinforcing bracket; vacant space can be fully used for reducing the thickness of the backlight module.

Preferably, the heatsink plate and the supporting plate are both made of metal material; because both of plates are made of metal, more varied connection modes can be provided; moreover, the strength is higher.

Preferably, the shapes and the areas of the heatsink plate and the supporting plate keep consistent. In the technical scheme, during production, the heatsink plate and the supporting plate can be put into the same cover die and formed by stamping; then, the processing steps are reduced, the production efficiency is enhanced, and the production cost is reduced; in addition, the utilization of dies is also reduced, saving the cost of the dies.

Preferably, the heatsink plate and the supporting plate are fixed in the mode of riveting or screw connection. This is a specific example of the heatsink plate and the supporting plate.

Preferably, the heatsink plate and the supporting plate are fixed in the mode of bonding by super glue. This is another specific example of the heatsink plate and the supporting plate.

Preferably, the heatsink plate and the supporting plate are fixed in the mode of lock seaming; the heatsink plate and the supporting plate are folded in the joint to form clamping slots and clamping plates; the clamping plate of the heatsink plate is embedded into the clamping slot of the supporting plate; meanwhile, the clamping plate of the supporting plate is also embedded into the clamping slot of the heatsink plate to form the lock seaming connection. This is a third specific example of the heatsink plate and the supporting plate. In the example, no other fixing material is used, thereby reducing the assembly steps and enhancing the assembly efficiency.

Preferably, the heatsink plate is arranged in the area of an LED lamp source fixing device of the backlight module. An LED is a major radiating device of the backlight module; in general, the LED is fixed on the LED lamp source fixing device such as an aluminum extrusion and the like; thus, the heatsink plate is arranged according to the area of the LED lamp source fixing device, so that the pertinence is higher, the area of the heatsink plate is further reduced, and the cost is reduced.

Preferably, the LED lamp source fixing device of the backlight module is an aluminium extrusion; the heatsink plate comes into contact with the aluminum extrusion. In the technical scheme, the heat can be passed from the aluminum extrusion to the heatsink plate in a heat conducting mode, and then can be dispersed to the outside air through the heatsink plate.

A backlight module, comprising: the aforementioned backplane of the backlight module.

An LCD device comprises the aforementioned backlight module.

Discovered through research, the backlight module does not uniformly radiate; only a part of the backplane performs a radiation action and the other part performs a supporting action instead of the radiation action; for the radiating part of the backplane, the metal with good heat dispersion is needed; for the supporting part of the backplane, only common material with certain strength is needed. In the present invention, the metal with good heat dispersion and the common material with low cost are respectively adopted and joined according to different radiating areas of the backlight module; then, the heat dispersion is ensured and meanwhile, the cost is reduced. However, because the strength of the joint is obviously influenced, the strength of the joined backplane is not strong enough and the image quality of the backlight module is influenced; thus, reinforcing ribs are especially added in the joint for enhancing the strength of the joint so that the backplane is tightened and durable.

Figure 1:
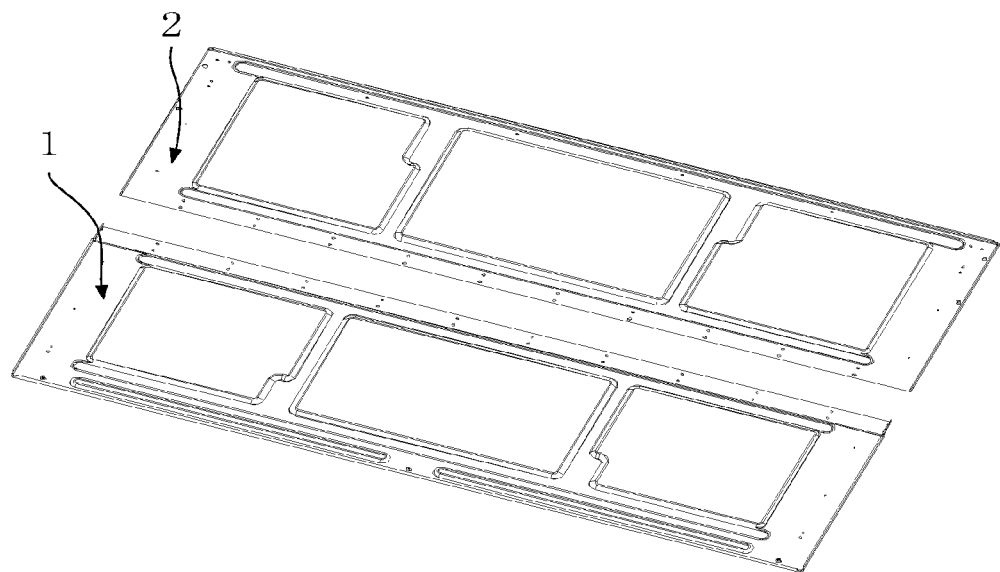
FIG. 1 is a schematic diagram of separating a heatsink plate and a supporting plate of the present invention.
Figure 2:
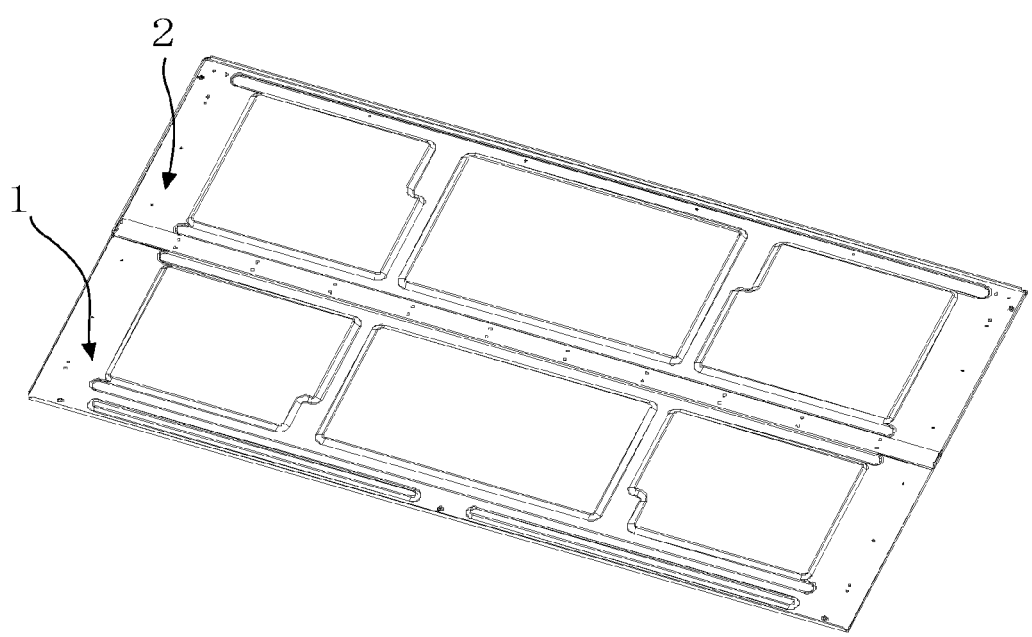
FIG. 2 is a schematic diagram of a heatsink plate and a supporting plate which are joined in the present invention.
Figure 3:
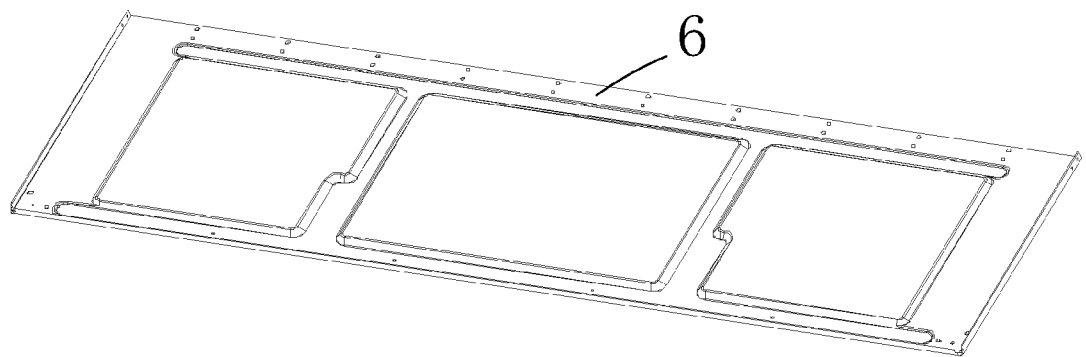
FIG. 3 is a schematic diagram of a heatsink plate and a supporting plate with reinforcing ribs in the present invention.
Figure 4:
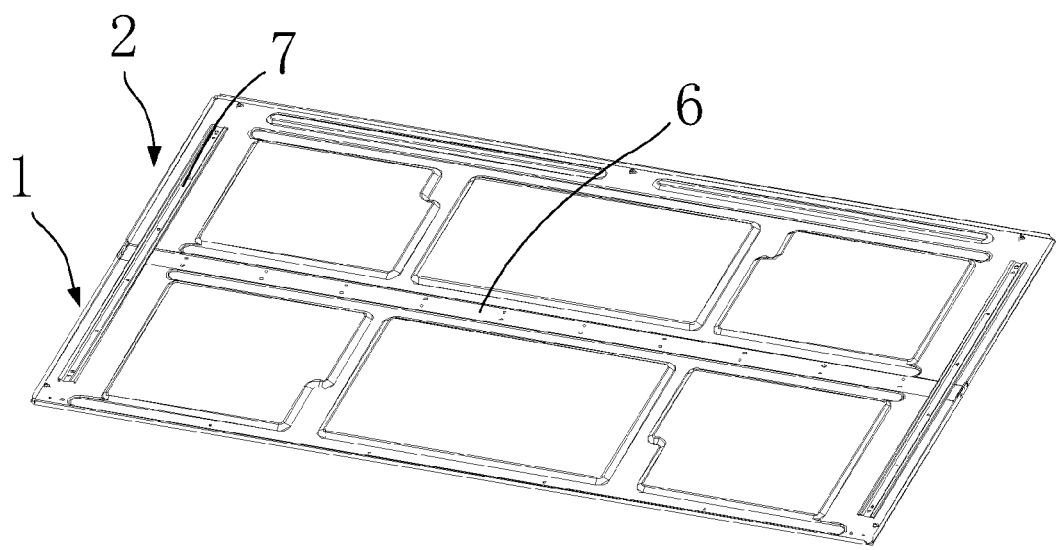
FIG. 4 is a schematic diagram of a backplane with a reinforcing bracket in the present invention.
Figure 5:
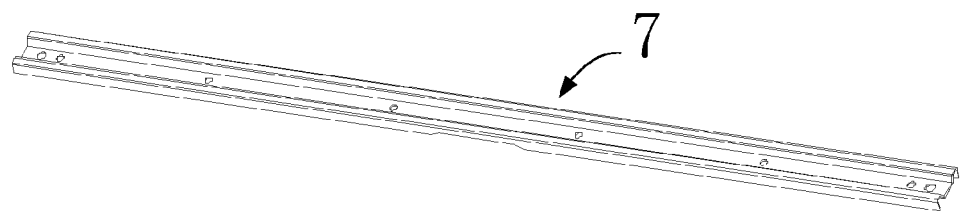
FIG. 5 is a schematic diagram of a reinforcing bracket in the present invention.
Figure 6:
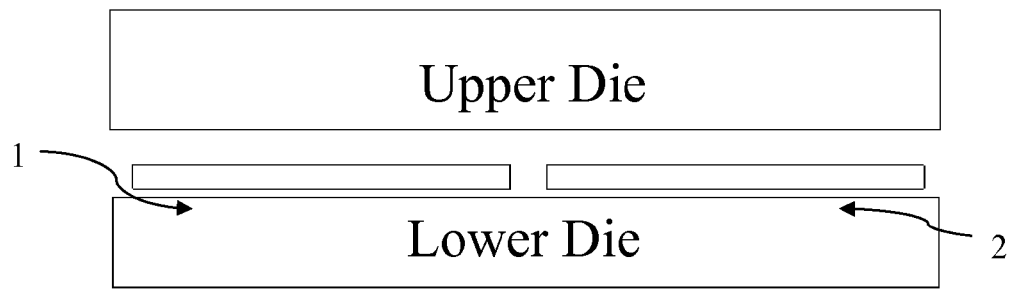
FIG. 6 is a schematic diagram of simultaneously processing a heatsink plate and a supporting plate through the same die in the present invention.
Figure 7:
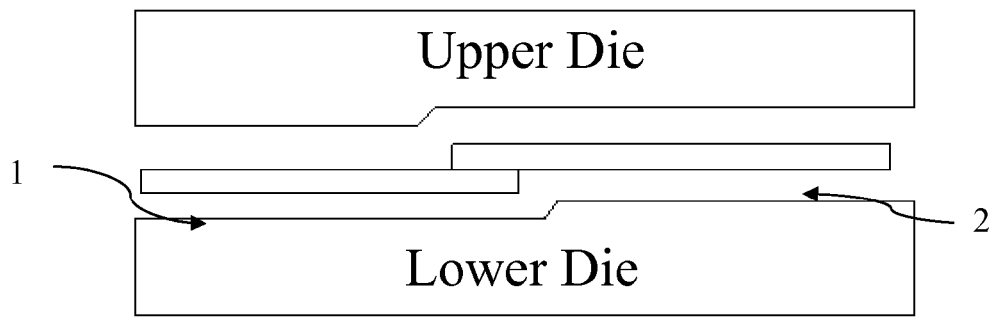
FIG. 7 is a schematic diagram of fixing a heatsink plate and a supporting plate by a manufacturing process of a riveting technology in the present invention.

Wherein: 1. heatsink plate; 2. supporting plate; 3. rivet; 4. super glue; 5. screw; 6. reinforcing rib; 7. reinforcing bracket.

DETAILED DESCRIPTION

The present invention will further be described in detail in accordance with the figures and the preferred examples.

The applicant applied a backplane of a backlight module, a backlight module and an LCD device on 12th of October; the application number is 201110308489.5. The application discloses a backplane structure formed by a heatsink plate and a supporting plate, as follows:

The LCD device comprises a backlight module; the bottom of the backlight module is provided with a backplane used for supporting internal devices and sealing the module and providing necessary protection. The backplane of the backlight module comprises a heatsink plate 1 and a supporting plate 2 connected with the heatsink plate 1; the heat conductivity of the heatsink plate 1 is larger than that of the supporting plate 2.

As shown in FIGS. 1 to 12, the LCD device of the present invention comprises a backlight module; the bottom of the backlight module is provided with a backplane used for supporting internal devices and sealing the module and providing necessary protection. The backplane of the backlight module comprises a heatsink plate 1 and a supporting plate 2 connected with the heatsink plate 1; the heat conductivity of the heatsink plate 1 is larger than that of the supporting plate 2; reinforcing ribs 6 are added in the joint of the heatsink plate 1 and the supporting plate 2; the heatsink plate 1 can be made of metal with good heat dispersion, such as aluminum and the like; the supporting plate 2 can be made of metal material of cheaper price, such as steel plates and the like, or low-cost material with certain strength, such as plastics and the like; the reinforcing ribs 6 can be arranged on the heatsink plate 1 or the supporting plate 2 or both of the heatsink plate 1 and the supporting plate 2; alternatively, the reinforcing ribs 6 can be individually added after the heatsink plate 1 and the supporting plate 2 are joined.

To further improve the planeness of the backplane, the reinforcing bracket 7 can be added between the heatsink plate 1 and the supporting plate 2; both ends of the reinforcing bracket 7 are respectively fixed on the heatsink plate 1 and the supporting plate 2; In order not to occupy the middle position of the backplane, the reinforcing bracket 7 is fixed on both ends of the joint of the heatsink plate 1 and the supporting plate 2, i.e. both ends of the backplane.

The heatsink plate 1 is arranged in the area of an LED lamp source fixing device of the backlight module. An LED is a major radiating device of the backlight module; In general, the LED is fixed on the LED lamp source fixing device such as aluminum extrusion and the like; taking an aluminum extrusion as an example, the aluminium extrusion can be installed on the heatsink plate 1 of the backplane; then, the heat can be quickly passed from the aluminum extrusion to the heatsink plate 1 in a heat conducting mode, and can be dispersed to the outside air through the heatsink plate 1.

Further, the shapes and the areas of the heatsink plate 1 and the supporting plate 2 keep consistent. During production, the heatsink plate 1 and the supporting plate 2 can be put into the same cover die and formed by stamping; then, the processing steps are reduced, the production efficiency is enhanced, and the production cost is reduced; in addition, the utilization of dies is also reduced, saving the cost of the dies.

Figure 8:
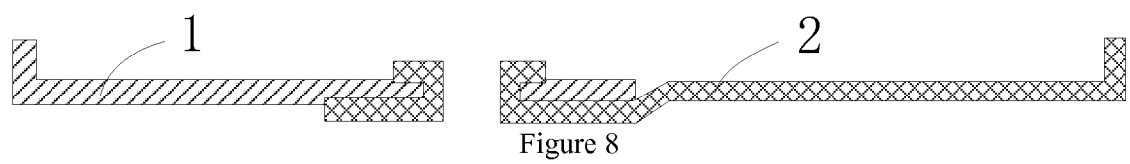
FIG. 8 is a schematic diagram of fixing a heatsink plate and a supporting plate in a non-rivet riveting mode in the present invention.
Figure 9:
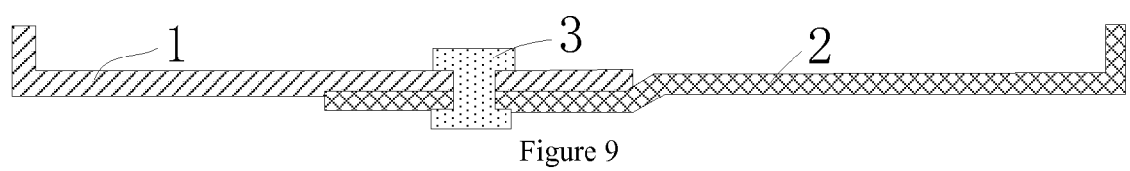
FIG. 9 is a schematic diagram of fixing a heatsink plate and a supporting plate in a riveting mode of rivets in the present invention.
Figure 10:
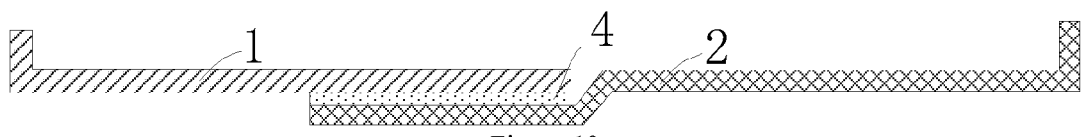
FIG. 10 is a schematic diagram of fixing a heatsink plate and a supporting plate in a bonding mode by super glue in the present invention.
Figure 11:
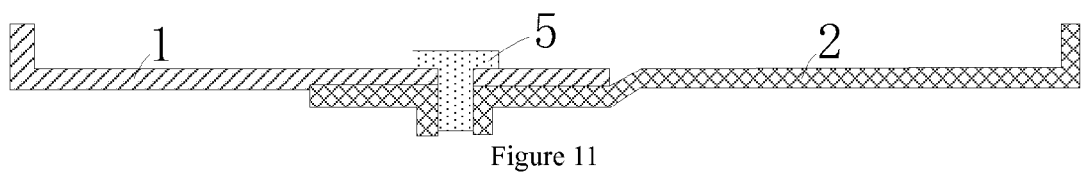
FIG. 11 is a schematic diagram of fixing a heatsink plate and a supporting plate in a screw connection mode in the present invention.
Figure 12:
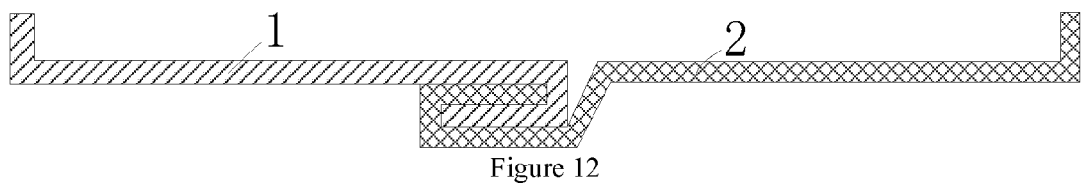
FIG. 12 is a schematic diagram of fixing a heatsink plate and a supporting plate in a lock seaming connection mode in the present invention.

The heatsink plate 1 and the supporting plate 2 can be fixed in the modes of riveting (as shown in FIG. 8 and FIG. 9), bonding by super glue 4 (as shown in FIG. 10), a screw 5 connection (as shown in FIG. 11), lock seaming connection (as shown in FIG. 12) and the like; the riveting can include riveting without a rivet 3 (as shown in FIG. 8) and riveting with the rivet 3 (as shown in FIG. 9). The fixing mode of the present invention will be further explained below in the lock seaming mode:

As shown in FIG. 12, the heatsink plate 1 and the supporting plate 2 are fixed in the lock seaming mode; the heatsink plate 1 and the supporting plate 2 are folded in the joint to form clamping slots and clamping plates; the clamping plate of the heatsink plate 1 is embedded into the clamping slot of the supporting plate 2; meanwhile, the clamping plate of the supporting plate 2 is also embedded into the clamping slot of the heatsink plate 1 to form the lock seaming connection. In the example, no other fixing material is used, thereby reducing the assembly steps and enhancing the assembly efficiency.

The present invention is described in detail in accordance with the above contents with the specific preferred examples. However, this invention is not limited to the specific examples. For the ordinary technical personnel of the technical field of the present invention, on the premise of keeping the conception of the present invention, the technical personnel can also make simple deductions or replacements, and all of which should be considered to belong to the protection scope of the present invention.

The invention claimed is:

1. A backplane, comprising a heatsink plate and a supporting plate connected with the heatsink plate; the heat conductivity of said heatsink plate is larger than the heat conductivity of said supporting plate; said heatsink plate or said supporting plate is provided with reinforcing ribs in a joint, and wherein said heatsink plate and said supporting plate are fixed in a mode of lock seaming; said heatsink plate and said supporting plate are folded in the joint to form clamping slots and clamping plates; the clamping plate of said heatsink plate is embedded into the clamping slot of said supporting plate; meanwhile, the clamping plate of said supporting plate is also embedded into the clamping slot of said heatsink plate to form said lock seaming connection.

2. The backplane of claim 1, wherein said heatsink plate and said supporting plate are both provided with reinforcing ribs in the joint.

3. The backplane of claim 1, wherein said backplane also comprises a reinforcing bracket; both ends of said reinforcing bracket are respectively fixed on said heatsink plate and said supporting plate.

4. The backplane of claim 3, wherein contact surfaces of said reinforcing bracket with said heatsink plate and said supporting plate are planes.

5. The backplane of claim 3, wherein said reinforcing bracket is fixed on both ends of the joint of said heatsink plate and said supporting plate.

6. The backplane of claim 1, wherein said heatsink plate and said supporting plate are both made of metal material.

7. The backplane of claim 1, wherein a shape and an area of the said heatsink plate is substantially similar with a shape and an area of the supporting plate.

8. A backlight module, comprising: a backplane comprises a heatsink plate and a supporting plate connected with the heatsink plate; the heat conductivity of said heatsink plate is larger than the heat conductivity of said supporting plate; said heatsink plate or said supporting plate is provided with reinforcing ribs in a joint, and wherein said heatsink plate and said supporting plate are fixed in a mode of lock seaming; said heatsink plate and said supporting plate are folded in the joint to form clamping slots and clamping plates; the clamping plate of said heatsink plate is embedded into the clamping slot of said supporting plate; meanwhile, the clamping plate of said supporting plate is also embedded into the clamping slot of said heatsink plate to form said lock seaming connection.

9. The backlight module of claim 8, wherein said heatsink plate and said supporting plate are both provided with reinforcing ribs in the joint.

10. The backlight module of claim 8, wherein said backplane also comprises a reinforcing bracket; both ends of said reinforcing bracket are respectively fixed on said heatsink plate and said supporting plate.

11. The backlight module of claim 10, wherein contact surfaces of said reinforcing bracket with said heatsink plate and said supporting plate are planes.

12. The backlight module of claim 10, wherein said reinforcing bracket is fixed on both ends of the joint of said heatsink plate and said supporting plate.

13. The backlight module of claim 8, wherein said heatsink plate and said supporting plate are both made of metal material.

14. The backlight module of claim 8, wherein a shape and an area of the said heatsink plate is substantially similar with a shape and an area of the supporting plate.

15. An LCD device, comprising: a backlight module comprises a backplane; said backplane comprises a heatsink plate and a supporting plate connected with the heatsink plate; the heat conductivity of said heatsink plate is larger than the heat conductivity of said supporting plate; said heatsink plate or said supporting plate is provided with reinforcing ribs in a joint, and wherein said heatsink plate and said supporting plate are fixed in a mode of lock seaming; said heatsink plate and said supporting plate are folded in the joint to form clamping slots and clamping plates; the clamping plate of said heatsink plate is embedded into the clamping slot of said supporting plate; meanwhile, the clamping plate of said supporting plate is also embedded into the clamping slot of said heatsink plate to form said lock seaming connection.

16. The LCD device of claim 15, wherein said heatsink plate and said supporting plate are both provided with reinforcing ribs in the joint.

17. The LCD device of claim 15, wherein said backplane also comprises a reinforcing bracket; both ends of the reinforcing bracket are respectively fixed on said heatsink plate and said supporting plate.

18. The LCD device of claim 17, wherein contact surfaces of said reinforcing bracket with said heatsink plate and said supporting plate are planes.

19. The LCD device of claim 17, wherein said reinforcing bracket is fixed on both ends of the joint of said heatsink plate and said supporting plate.

20. The LCD device of claim 15, wherein, said heatsink plate and said supporting plate are both made of metal material.

21. The LCD device of claim 15, wherein a shape and an area of the said heatsink plate is substantially similar with a shape and an area of the supporting plate.

\* \* \* \* \*